US011088217B2

(12) United States Patent
Shin et al.

(10) Patent No.: US 11,088,217 B2
(45) Date of Patent: Aug. 10, 2021

(54) OLED MODULE AND DISPLAY DEVICE HAVING THE SAME

(71) Applicant: LG Display Co., Ltd., Seoul (KR)

(72) Inventors: Jung-Hoon Shin, Gimpo-si (KR); Kyung-Tae Park, Gimpo-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/670,339

(22) Filed: Oct. 31, 2019

(65) Prior Publication Data
US 2020/0176528 A1 Jun. 4, 2020

(30) Foreign Application Priority Data

Nov. 30, 2018 (KR) .......................... 10-2018-0152484

(51) Int. Cl.
*H01L 27/32* (2006.01)
*G06F 1/20* (2006.01)
*G06F 1/16* (2006.01)
*H01L 51/52* (2006.01)

(52) U.S. Cl.
CPC ........ *H01L 27/3225* (2013.01); *G06F 1/1626* (2013.01); *G06F 1/203* (2013.01); *H01L 27/3276* (2013.01); *H01L 51/5237* (2013.01)

(58) Field of Classification Search
CPC ............. H01L 27/3225; H01L 27/3276; H01L 51/5237–525; G06F 1/1626; G06F 1/203; G06F 1/20–206; G02F 1/133308–133328; G02F 1/13452
See application file for complete search history.

(56) References Cited

U.S. PATENT DOCUMENTS

| 6,847,415 | B1* | 1/2005 | Yoshimura | G02F 1/13452 349/149 |
| 2009/0207560 | A1* | 8/2009 | Lee | H01L 51/5243 361/679.01 |
| 2010/0259881 | A1* | 10/2010 | Choi | G06F 1/1632 361/679.21 |
| 2013/0170156 | A1* | 7/2013 | Jung | H05K 5/0017 361/749 |

FOREIGN PATENT DOCUMENTS

CN 205793602 U * 12/2016

OTHER PUBLICATIONS

CN-205793602-U English machine translation retrieved from Espacenet (Year: 2016).*

* cited by examiner

*Primary Examiner* — Mariceli Santiago
(74) *Attorney, Agent, or Firm* — Birch, Stewart, Kolasch & Birch LLP

(57) ABSTRACT

An OLED module can include a panel, a middle frame coupled to a rear surface of the panel, a PCB assembly provided at the outside of the panel, connected to the panel and folded to be arranged on a rear surface of the middle frame, and a back cover coupled to an outer surface of the middle frame provided with the PCB assembly arranged thereon.

12 Claims, 5 Drawing Sheets

OLED MODULE AND DISPLAY DEVICE HAVING THE SAME

CROSS-REFERENCE TO RELATED APPLICATION

This application claims the priority benefit of Korean Patent Application No. 10-2018-0152484, filed on Nov. 30, 2018 in the Republic of Korea, which is hereby incorporated by reference as if fully set forth herein.

BACKGROUND OF THE INVENTION

Field of the Invention

The present invention relates to a display device, and more particularly, to a display device having an OLED (organic light emitting diode) module.

Discussion of the Related Art

Recently, in the information-oriented society, importance of display devices as a visual information transfer medium has been emphasized and, in order to occupy a main position in the future, display devices should satisfy requirements, such as low power consumption, thinness, light-weight, high definition, etc.

Displays are divided into: (a) an emissive type which autonomously emits light, such as a cathode ray tube (CRT), an electroluminescent (EL) element, a light emitting diode (LED), a vacuum fluorescent display (VFD), a field emission display (FED), a plasma display panel (PDP) and an organic light emitting diode (OLED), and (b) a non-emissive type which cannot autonomously emit light, such as a liquid crystal display (LCD).

A display device employing organic light emitting diodes (OLEDs) includes an OLED module. The OLED module includes a panel on which a hole injection electrode (anode), an organic emission layer and an electron injection electrode (cathode), and light emission is carried out by energy generated when excitons formed by coupling between electrons and holes in the organic emission layer transition from an excited state to a ground state.

That is, the panel of the OLED display device uses a principle in which an anode layer, an organic material layer and a cathode layer are sequentially stacked on a substrate, and a proper energy difference is formed in the organic material layer by applying the voltage applied between the anode layer and the cathode layer so that the OLED display device spontaneously emits light.

The OLED display device has self-emissive characteristics due to such a principle, requires no separate light source in contrast with a liquid crystal display device, and can thus reduce thickness and weight. Further, the OLED display device exerts high quality characteristics, such as lower power consumption, high luminance, high reaction speed, etc., and is thus regarded as a next generation display device of portable electronic equipment.

In order to drive the OLED module, a printed circuit board (PCB) is used, and the PCB is fixedly installed on the rear surface of the panel of the OLED module.

However, the PCB fixed to the rear surface of the panel of the OLED module causes temperature rise, and can thus raise the surface temperature of a cover glass located on the OLED module and cause degradation of various elements.

SUMMARY OF THE INVENTION

Accordingly, the present invention is directed to an OLED module and a display device having the same that substantially obviate one or more problems due to limitations and disadvantages of the related art.

An object of the present invention is to provide a display device which can address limitations associated with heat generated from an OLED module, so as to lower the surface temperature of a cover glass and to prevent degradation of elements.

Additional advantages, objects, and features of the invention will be set forth in part in the description which follows and in part will become apparent to those having ordinary skill in the art upon examination of the following or can be learned from practice of the invention. The objectives and other advantages of the invention can be realized and attained by the structure particularly pointed out in the written description and claims hereof as well as the appended drawings.

To achieve these objects and other advantages and in accordance with the purpose of the invention, as embodied and broadly described herein, an OLED module includes a panel, a middle frame coupled to a rear surface of the panel, a PCB assembly provided at the outside of the panel, connected to the panel and folded to be arranged on a rear surface of the middle frame, and a back cover coupled to an outer surface of the middle frame provided with the PCB assembly arranged thereon.

The OLED module can further include a detachable tape coupled to one surface of the PCB assembly.

The middle frame can include a PCB mounting part configured to mount the PCB assembly thereon.

The middle frame can include a heat-radiating material.

The PCB assembly can include connection cables connected to the panel and a PCB coupled to the connection cables.

The PCB mounting part can include a region recessed from the middle frame so as to correspond to thicknesses and shapes of the connection cables and the PCB.

The PCB mounting part can be arranged in central and lower regions of the middle frame.

The detachable tape can be a stretch tape.

The OLED module can further include a radiation fan arranged in the back cover or on a rear surface thereof.

The back cover can have a shape protruding outwardly so as to form an air pocket therein.

In another aspect of the present invention, a display device includes a cover glass, a panel arranged under the cover glass, and an OLED module including a middle frame coupled to a rear surface of the panel, a PCB assembly provided at the outside of the panel, connected to the panel and folded to be arranged on a rear surface of the middle frame, and a back cover coupled to the middle frame provided with the PCB assembly arranged thereon.

The display device can further include a detachable tape coupled to one surface of the PCB assembly.

The middle frame can include a PCB mounting part configured to mount the PCB assembly thereon.

The middle frame can include a heat-radiating material.

The PCB assembly can include connection cables connected to the panel and a PCB coupled to the connection cables.

The PCB mounting part can include a region recessed from the middle frame so as to correspond to thicknesses and shapes of the connection cables and the PCB.

The PCB mounting part can be arranged in central and lower regions of the middle frame.

The detachable tape can be a stretch tape.

The display device can further include a radiation fan arranged in the back cover or on a rear surface thereof.

The back cover can have a shape protruding outwardly so as to form an air pocket therein.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EMBODIMENTS

Figure 1:
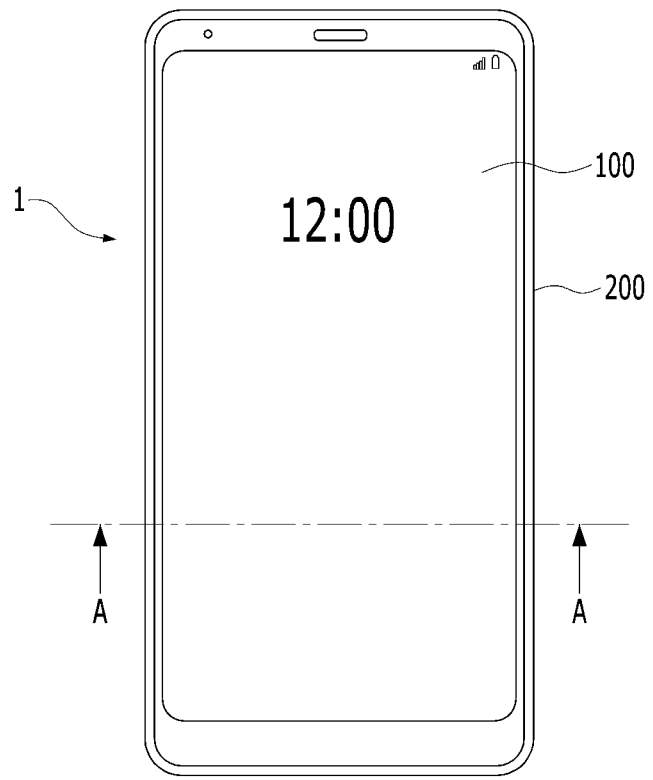
FIG. 1 is a front view of a display device in accordance with one embodiment of the present invention.

Reference will now be made in detail to the preferred embodiments of the present invention, examples of which are illustrated in the accompanying drawings. In the following description of the embodiments, it will be understood that, when a part, such as a layer (film), a region, a pattern or a structure, is said to be "on" or "under" another part, such as a substrate, another layer (film), a region, a pad or a pattern, the part can be located "directly on" or "directly under" the other part or other parts can be interposed between both parts. In addition, it will be understood that a criteria for the upward direction or the outward direction of each layer is described based on the drawings.

Shapes, sizes, rates, angles, numbers, etc. disclosed in the drawings are exaggerated, omitted or schematically illustrated for convenience and clarity of description. Further, sizes of respective elements do not entirely reflect actual sizes of the elements. In the following description of the embodiments, the same elements are denoted by the same reference numerals even though they are depicted in different drawings. Hereinafter, the embodiments of the present invention will be described with reference to the accompanying drawings.

Figure 2:
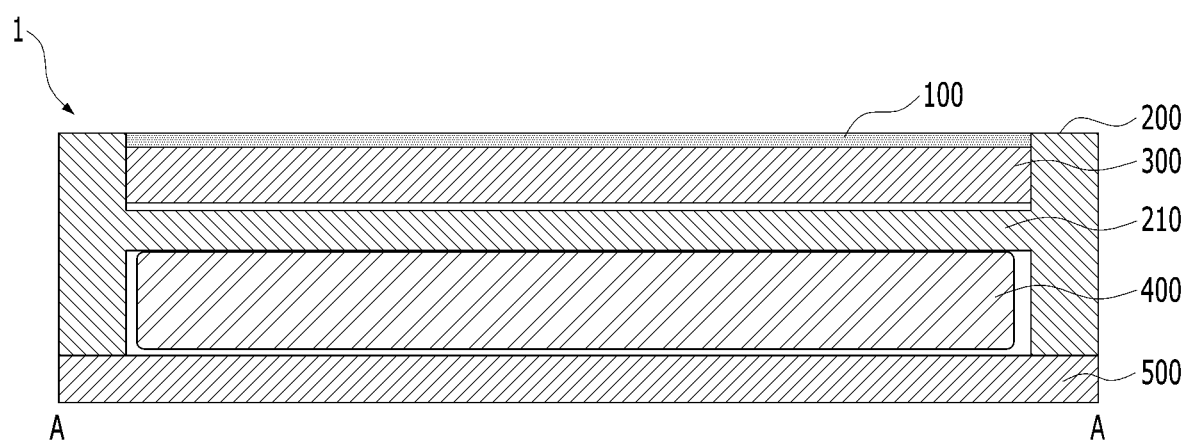
FIG. 2 is a cross-sectional view of FIG. 1, taken along line A-A.

FIG. 1 is a front view of a display device in accordance with one embodiment of the present invention, and FIG. 2 is a cross-sectional view of FIG. 1, taken along line A-A. All components of the display device according to all embodiments of the present invention are operatively coupled and configured.

Referring to FIGS. 1 and 2, a display device 1 in accordance with one embodiment of the present invention can include a cover glass 100, a set frame 200, an OLED module 300, a battery 400, and a cover bottom 500.

The cover glass 100 can cover the entirety of a display area of the display device 1. The cover glass 100 can have a very thin thickness, and polarizing plate hard coating can be performed on the upper surface of the cover glass 100 or a protective film can be attached thereto.

Further, the cover glass 100 can have a touch panel. The touch panel can employ a resistive type in which sensors responding to pressure applied to the surface of the touch panel are densely installed and, when pressure is applied, a position of the applied pressure is detected through coordinates, or a capacitive type in which the surface of the cover glass 100 is charged with charges, and sensors are installed therearound and sense a degree of charge loss to detect a touch point.

The OLED module 300 is arranged under the cover glass 100. The OLED module 300 can be referred to as an EL module. The OLED module 300 includes an anode, a cathode and organic compound layers formed between the anode and the cathode. The organic compound layers include a hole injection layer (HIL), a hole transport layer (HTL), an emission layer (EML), an electron transport layer (ETL) and an electron injection layer (EIL). When driving voltage is applied to the anode and the cathode, holes passed through the hole transport layer (HTL) and electrons passed through the electron transport layer (ETL) move to the emission layer (EML) and thus form excitons, and consequently, the emission layer (EML) emits visible light.

Further, the OLED module 300 includes pixels, each of which includes an OLED, arranged in a matrix, and adjusts luminance of the pixels according to gradation of video data. Each of the pixels includes a driving thin film transistor (TFT) which controls driving current flowing in the OLED according to voltage Vgs applied between a gate electrode and a source electrode of the driving TFT, and can adjust display gradation (luminance) using an amount of light emitted from the OLED being directly proportional to such driving current.

The set frame 200 receives and supports the cover glass 100 and the OLED module 300, and can be referred to by various names, such as an upper frame, an upper cover, a case, a housing, etc. For example, the set frame 200 can be formed of aluminum (Al) and include various materials, such as plastic.

A support plate 210 is provided on the set frame 200 and arranged under the OLED module 300. For example, the set frame 200 can include a frame which receives the cover glass 100 and the OLED module 300 and forms an external appearance of the display device 1, and the support plate 210 located in the horizontal direction within the frame.

Therefore, the cover glass 100 and the OLED module can be sequentially located in an upper region of the support plate 210, and the battery 400 can be arranged under the support palate 210.

In a region referred to by the battery 400, not only the battery 400 but also other elements necessary to drive the OLED can be located.

The cover bottom 500 can be located under the battery 400 and coupled to the set frame 200 to support the battery 400 and the elements necessary to drive the OLED and to form an external appearance of a lower portion of the display device 1. For example, the cover bottom 500 can include a bottom part alone or further include a side surface part. That is, the cover bottom 500 can include a bottom part having a rectangular plate shape and a side surface part protruding upward from one side of the bottom part to a constant height.

Of course, the above-described cover bottom 500 is merely exemplary, and cover bottoms having various shapes can be applied to the display device 1 in accordance with the present invention.

Figure 3A:
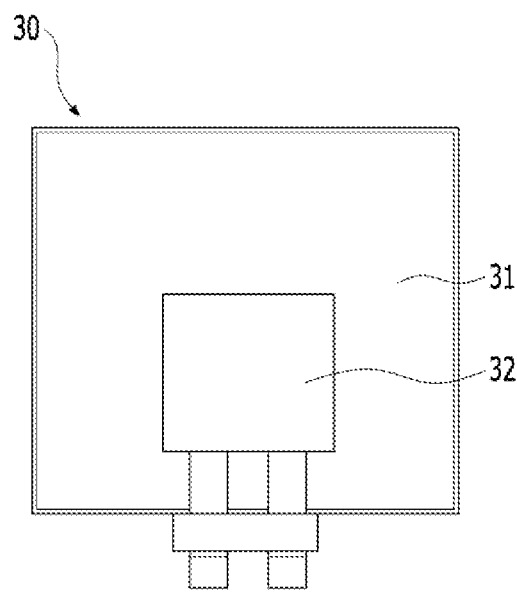
FIG. 3A is a view illustrating the structure of a rear surface of an OLED module according to a related art.
Figure 3B:
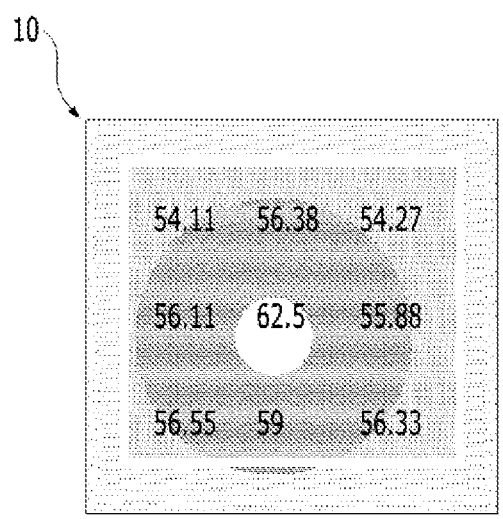
FIG. 3B is a view illustrating temperature simulation results of a cover glass of the OLED module of FIG. 3A.

FIG. 3A is a view illustrating the structure of a rear surface of an OLED module according to a related art, and FIG. 3B is a view illustrating temperature simulation results of a cover glass of the OLED module of FIG. 3A.

Referring to FIG. 3A, in order to drive an OLED module 30 according to the related art, a printed circuit board (PCB) 32 is used. Here, the PCB 32 contacts a rear surface of a panel 31 of the OLED module 30, and is fixed by a cover shield.

The PCB fixed to the rear surface of the panel 31 of the OLED module 30 is a main heating source which causes temperature rise, and can thus raise the surface temperature (particularly, of a central region) of a cover glass 10 located on the OLED module 30 and cause degradation of various elements.

Therefore, one embodiment of the present invention can provide an OLED module which can address problems caused by heat generated from an OLED module of the related art, so as to lower the surface temperature of a cover glass and prevent degradation of elements, and the embodiment of the present invention can provide a display device having such OLED module.

FIGS. 4A and 4B and FIGS. 5A and 5B are views illustrating an assembly process of the OLED module in accordance with one embodiment of the present invention.

As exemplarily shown in FIGS. 4A and 4B and FIGS. 5A and 5B, the OLED module 300 in accordance with this embodiment can include a panel 310, a PCB assembly 320, a middle frame 340 and a back cover 350.

The panel 310 can include the above-described anode, cathode and organic compound layers HIL, HTL, EML, ETL and EIL. For example, the panel 310 can have a square or rectangular shape, or have various other shapes. Further, the panel 310 can be a plastic OLED (POLED) panel which can be formed to be bendable using plastic having good elasticity.

Figure 4A:
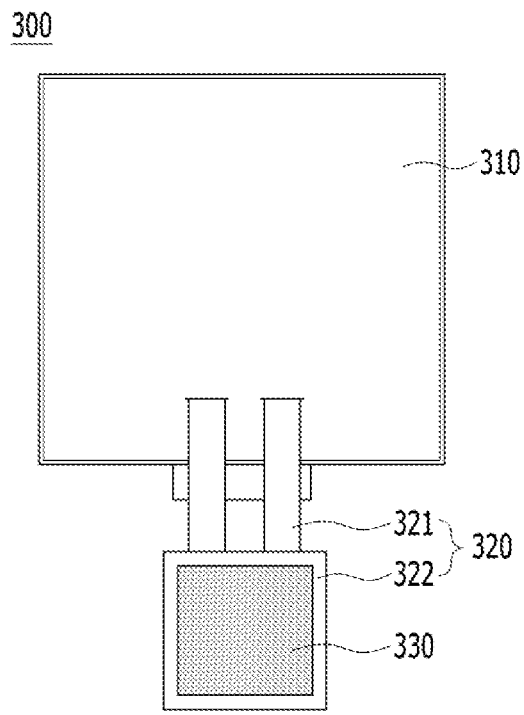
FIGS. 4A and 4B and FIGS. 5A and 5B are views illustrating an assembly process of an OLED module in accordance with one embodiment of the present invention.
Figure 4B:
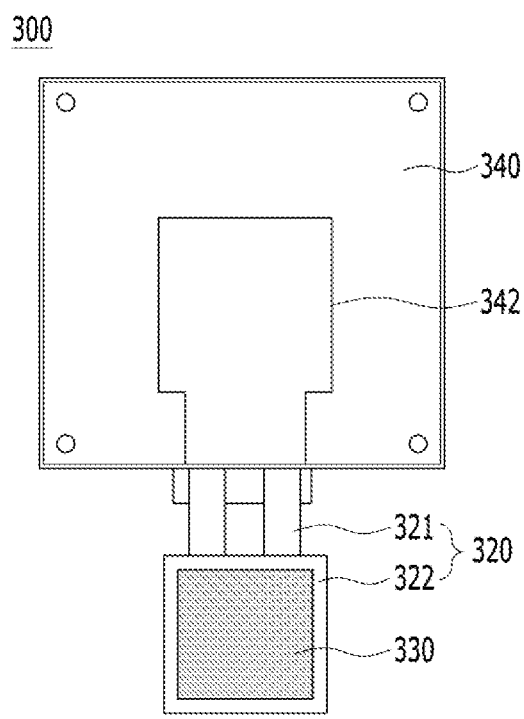

The PCB assembly 320 can be provided at the outside of the panel 310 and coupled to the panel 310 so as to drive the OLED module 300, as exemplarily shown in FIGS. 4A and 4B. For example, the PCB assembly 320 can include connection cables 321 connected to the panel 310, and a PCB 322 coupled to the connection cables 321.

The connection cables 321 can have a designated length and connect the PCB 322 located at the outside of the panel 310 to the panel 310. For example, a pair of connection cables 321 spaced apart from each other can be provided, or one connection cable 321 or three or more connection cables 321 can be provided.

Further, the connection cables 321 can be formed of a flexible material and be folded so that the PCB 222 are located on the rear surface of the panel 310. The connection cables 321 can be referred to as flexible flat cables (FFCs).

The PCB 322 has various shapes, such as a rectangular shape, and one side of the PCB 322 is connected to the connection cables 321. The PCB 322 can be referred to as a printed circuit board. Further, the PCB 322 can be referred to as a center-PCB, a control-PCB, a C-PCB or the like.

The middle frame 340 can be coupled to the rear surface of the panel 310, as exemplarily shown in FIG. 4B. For example, the middle frame 340 can have a shape corresponding to the shape of the panel 310, and be detachably coupled to the panel 130 so as to surround the panel 310.

The middle frame 340 can include a heat-radiating material. For example, the middle frame 340 can be formed of aluminum (Al), or be formed of various other materials which can block direct heat transfer to the panel 310.

Further, the middle frame 340 can include a PCB mounting part 342 to stably mount the PCB assembly 320 thereon. The PCB mounting part 342 can include a region recessed from the middle frame 340 so as to correspond to the thicknesses and shapes of the connection cables 321 and the PCB 322, as exemplarily shown in FIG. 4B. For example, the PCB mounting part 342 can be arranged in central and lower regions of the middle frame 340. Of course, according to embodiments, the PCB mounting part 342 can have a shape protruding from the middle frame 340 so as to space the PCB assembly 320 farther apart from the panel 310.

The above-described PCB assembly 320 provided at the outside of the panel 310 is connected to the panel 310, as exemplarily shown in FIG. 4A, and a part of the PCB assembly 320 can be exposed under the condition that the PCB assembly 320 is coupled to the middle frame 340.

Further, the PCB assembly 320 can be transported under the condition that the PCB assembly 320 is attached to the rear surface of the panel 310 without coupling of the middle frame 340 thereto, as occasion demands (for example, supply to a customer, screen inspection, progression of aging, or the like)

For this purpose, a detachable tape 330 can be coupled to one surface of the PCB assembly 330. The detachable tape 330 can be easily attachable and detachable by proper force without a great expenditure of energy. Particularly, the detachable tape 330 needs to maintain proper performance so as not to damage the middle frame 340 or leave a residue.

Therefore, the detachable tape 330 can be implemented as a stretch tape. The stretch tape is a product designed to lose adhesive force of an adhesive interface thereof and thus to be easily attachable and detachable, when it stretches in the horizontal direction, and any tape, which can have the above-described effects, can be referred to as a stretch tape.

The PCB assembly 320 connected to the panel 310 can be transported or stored under the condition that the PCB assembly 320 is attached to the central region of the panel 310 by the detachable tape 330.

However, in order to constitute the OLED module 300, after the PCB assembly 320 connected to the panel 310 is exposed to the outside of the panel 310, a part of the PCB assembly 320 can be exposed to the outside of the middle frame 340, as exemplarily shown in FIGS. 4A and 4B.

Figure 5A:
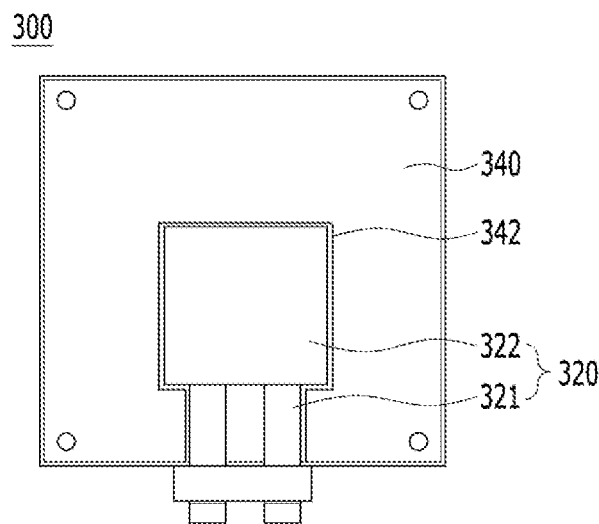
Figure 5B:
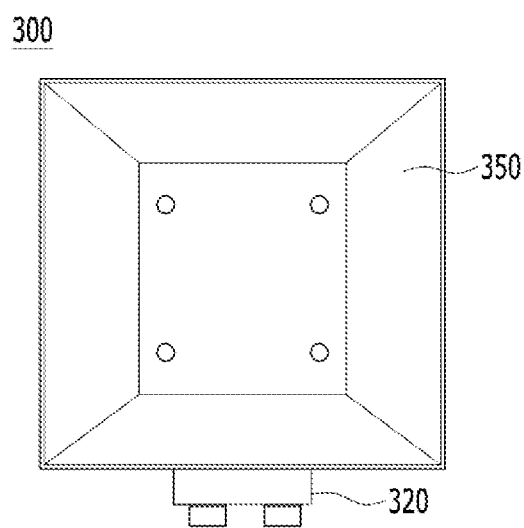

Thereafter, as the connection cables 321 of the PCB assembly 320 are folded, the PCB 322 can be arranged on the rear surface of the middle frame 340, as exemplarily shown in FIG. 5(a). Here, the detachable tape 330 coupled to the PCB assembly 320 (for example, the PCB 322) can be attached to the PCB mounting part 342 of the middle frame 340, and the PCB assembly 320 can be fixed to the rear surface of the middle frame 340.

The back cover 350 can be coupled to the outer surface of the middle frame 340 on which the above-described PCB assembly 320 is arranged. The back cover 350 can have a shape corresponding to the shapes of the panel 310 and the middle frame 340 and form the rear surface of the OLED module 300.

Further, the back cover 350 can have a shape protruding outwardly so as to form an air pocket therein. Accordingly, even if the PCB assembly 320 located between the back cover 350 and the middle frame 340 generates heat, cooling efficiency can be increased by the air pocket. The back cover 350 can be formed of a heat-radiating material, and a plurality of through holes to emit heat can be formed through the outer surface of the back cover 350.

A radiation fan can be arranged in the back cover 350 or on the rear surface thereof so as to increase heat dissipation efficiency.

Figure 6A:
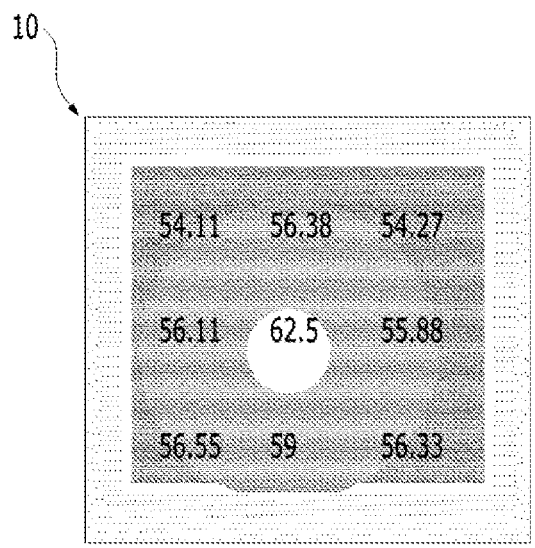
FIGS. 6A and 6B are views comparatively illustrating temperature simulation results of the cover glass of the OLED module of the related art, and a cover glass of the OLED module in accordance with one embodiment of the present invention.
Figure 6B:
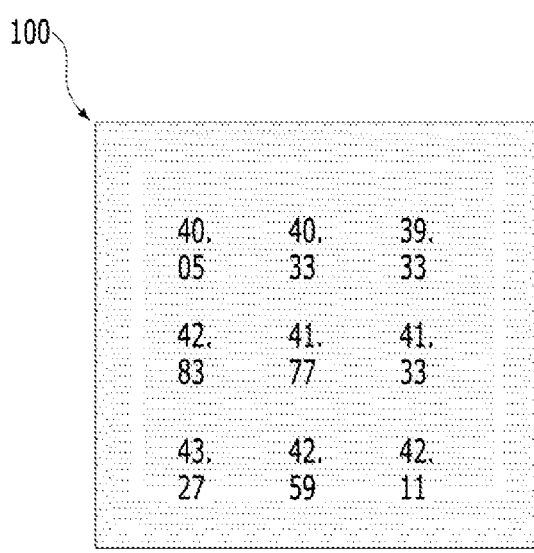

FIGS. 6A and 6B are views comparatively illustrating temperature simulation results of the cover glass of the OLED module of the related art, and the cover glass of the OLED module in accordance with one embodiment of the present invention.

As seen from temperature measurement results of the cover glass 10 of the display device employing the OLED module 30 of the related art, and the cover glass 100 of the display device 1 employing the OLED module 300 in accordance with one embodiment of the present invention, as exemplarily shown in FIGS. 6A and 6B, it can be confirmed that the surface temperature of the cover glass 100 in accordance with one embodiment is remarkably lowered, as compared to the surface temperature of the cover glass 10 of the related art (for example, the temperature (41.77 degrees) of the central region of the cover glass 100 is greatly lower than the temperature (62.5 degrees) of the central region of the cover glass 10).

The above-described display device in accordance with the present invention can be applied to various electronic equipment, such as a TV, a smartphone, a tablet PC, etc.

As apparent from the above description, in a display device in accordance with one or more embodiments of the present invention, since a PCB assembly is provided to be detachably attached to an OLED module and is spaced apart from a panel, problems caused by heat generated from the OLED module are addressed or overcome, and thus, the surface temperature of a cover glass can be lowered and degradation of elements can be prevented or minimized.

Further, in the display device in accordance with one or more embodiments of the present invention, the PCB assembly to which a detachable tape is coupled can be transported under the condition that the PCB assembly is attached to the rear surface of the panel as occasion, such as supply to a customer, screen inspection, progression of aging, or the like, demands, and be easily detached from the panel, thus improving assembly efficiency.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An organic light emitting diode (OLED) module comprising:
   a panel;
   a middle frame coupled to a rear surface of the panel;
   a printed circuit board (PCB) assembly provided outside of the panel, connected to the panel and folded to be arranged on a rear surface of the middle frame;
   a back cover coupled to an outer surface of the middle frame provided with the PCB assembly arranged thereon; and
   a PCB mounting part configured to mount the PCB assembly in the middle frame,
   wherein the PCB mounting part comprises;
      a first region recessed from the middle frame so as to correspond to thicknesses and shapes of connection cables, and
      a second region recessed from the middle frame so as to correspond to thicknesses and shapes of a PCB,
   wherein the second region of the PCB mounting part is arranged in central regions of the middle frame, and the first region of the PCB mounting part is arranged in lower regions of the middle frame,
   wherein the second region of the PCB mounting part is formed larger than the first region of the PCB mounting part on a plane, and
   wherein a detachable tape is coupled to one surface of the PCB and the second region of the PCB mounting part.

2. The OLED module according to claim 1, wherein the middle frame includes a heat-radiating material.

3. The OLED module according to claim 1, wherein the PCB assembly comprises:
   the connection cables connected to the panel; and
   the PCB coupled to the connection cables.

4. The OLED module according to claim 1, wherein the detachable tape is a stretch tape.

5. The OLED module according to claim 1, further comprising a radiation fan arranged in the back cover or on a rear surface of the back cover.

6. The OLED module according to claim 1, wherein the back cover has a shape protruding outwardly so as to form an air pocket therein.

7. A display device comprising:
   a cover glass;
   a panel arranged under the cover glass;
   an organic light emitting diode (OLED) module comprising a middle frame coupled to a rear surface of the panel, a printed circuit board (PCB) assembly provided outside of the panel, connected to the panel and folded to be arranged on a rear surface of the middle frame, and a back cover coupled to the middle frame provided with the PCB assembly arranged thereon; and
   a PCB mounting part configured to mount the PCB assembly in the middle frame,
   wherein the PCB mounting part comprises;
      a first region recessed from the middle frame so as to correspond to thicknesses and shapes of connection cables, and
      a second region recessed from the middle frame so as to correspond to thicknesses and shapes of a PCB,
   wherein the second region of the PCB mounting part is arranged in central regions of the middle frame, and the first region of the PCB mounting part is arranged in lower regions of the middle frame,
   wherein the second region of the PCB mounting part is formed larger than the first region of the PCB mounting part on a plane, and
   wherein a detachable tape is coupled to one surface of the PCB and the second region of the PCB mounting part.

8. The display device according to claim 7, wherein the middle frame includes a heat-radiating material.

9. The display device according to claim 7, wherein the PCB assembly comprises:
   the connection cables connected to the panel; and
   the PCB coupled to the connection cables.

10. The display device according to claim 7, wherein the detachable tape is a stretch tape.

11. The display device according to claim 7, wherein the OLED module further comprises a radiation fan arranged in the back cover or on a rear surface of the back cover.

12. The display device according to claim 7, wherein the back cover has a shape protruding outwardly so as to form an air pocket therein.

* * * * *